(12) United States Patent
Deng

(10) Patent No.: US 8,791,682 B2
(45) Date of Patent: Jul. 29, 2014

(54) NOISE REJECTING HIGH-SIDE POWER SWITCH

(76) Inventor: Qi Deng, San Jose, CA (US)

(*) Notice: Subject to any disclaimer, the term of this patent is extended or adjusted under 35 U.S.C. 154(b) by 164 days.

(21) Appl. No.: 13/100,289

(22) Filed: May 3, 2011

(65) Prior Publication Data

US 2012/0280751 A1    Nov. 8, 2012

(51) Int. Cl.
*G05F 3/04*    (2006.01)
*G05F 3/08*    (2006.01)

(52) U.S. Cl.
USPC .......................................... 323/312; 330/260

(58) Field of Classification Search
USPC ................................. 323/312–316
See application file for complete search history.

(56) References Cited

U.S. PATENT DOCUMENTS

| | | | |
|---|---|---|---|
| 6,861,896 B2* | 3/2005 | Tsividis et al. | 327/552 |
| 2002/0036519 A1* | 3/2002 | Krishnapura et al. | 327/65 |
| 2007/0241737 A1* | 10/2007 | Yen et al. | 323/314 |

* cited by examiner

*Primary Examiner* — Adolf Berhane
*Assistant Examiner* — Emily P Pham
(74) *Attorney, Agent, or Firm* — Ariel S. Bentolila; Bay Area IP Group, LLC

(57) ABSTRACT

An apparatus includes a pass element comprising an input, an output and a control input. The pass element, with a first signal on the control input, passes a voltage from the input to the output and, with a second signal on the control input, blocks the voltage on the input from passing to the output. A differential amplifier includes a non-inverting input coupled to the input, an inverting input coupled to the output, an amplifier output coupled to the control input and a bias current connection. The differential amplifier, with a bias current supplied, supplies the first signal along with a closed feedback loop from the output and supplies the second signal in absence of the bias current. A current source is coupled to the bias current connection and an enable input. The current source supplies the bias current and, in absence of an enable signal, disables the bias current.

20 Claims, 4 Drawing Sheets

NOISE REJECTING HIGH-SIDE POWER SWITCH

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection. The copyright owner has no objection to the facsimile reproduction by anyone of the patent document or patent disclosure as it appears in the Patent and Trademark Office, patent file or records, but otherwise reserves all copyright rights whatsoever.

FIELD OF THE INVENTION

The present invention relates generally to high-side power switches and more specifically to high-side power switches capable of rejecting noise associated with power supplies.

BACKGROUND OF THE INVENTION

In today's electrical devices and equipment, certain subsystems may require a low noise power supply for proper operation. One example of a subsystem which may require a low noise power supply for proper operation is the Radio Frequency (RF) subsystem associated with communication equipment for transmitting and receiving RF signals. An RF subsystem is often powered by a low noise power supply, as significant noise associated with the power supply may interfere with RF operation. As an example, significant noise from the power supply may be coupled or modulated onto the transmitted RF signal, potentially rendering it unrecoverable by an RF receiver.

Usually, on the system level, such communication equipment is often powered by a single system power supply providing multiple differing voltage rails to the various subsystems. In addition, the subsystems may incorporate a multiplicity of differing voltage rails for supplying power to the associated functional blocks. The subsystems, and functional blocks associated with the subsystems, produce noise with the potential for the noise being coupled back onto the system power supply. Furthermore, the coupling of system noise associated with the system power supply may render the system power supply as "noisy." As such, the noise coupling associated with the system power supply may require rejection for providing adequate clean power to electrical subsystems.

A power switch is commonly used to connect and disconnect a system power supply from a subsystem (e.g. RF subsystem). Furthermore, the multiple voltage rails used to power the functional blocks within the subsystem may be generated by internal voltage regulators incorporating a noise rejection function. Since there may be multiple voltage rails in the subsystem, a multiplicity of voltage regulators may be deployed for performing noise rejection. The deployment of multiple voltage regulators increases design complexity as well as subsystem cost and system cost.

Power switches deployed may often be configured as "high-side" type connecting and disconnecting the load associated with a power source, as opposed to "low-side" type, which may be configured for performing connecting and disconnecting associated with ground potential.

A typical high-side power switch employs a "Pass Element" connecting (i.e. ON) and disconnecting (i.e. OFF) a load associated with a system power supply. Furthermore, a typical high-side power switch employs a "Gate Drive and Level Shift (GDLS)" circuit for controlling the ON/OFF condition for the pass element. The GDLS is often controlled by an enable input for configuring the ON/OFF condition.

Typically, the pass element of a high-side power supply switch is a PNP transistor, or a P-channel MOSFET. Since a P-channel MOSFET is often used in today's semiconductor-based high-side power switches as the pass element, a P-channel MOSFET will be used to illustrate the circuit implementations for the pass element described in the following paragraphs with reference to the figures.

FIG. 1 presents an illustration of a conventional high-side power switch.

A high-side power switch 100 includes an input voltage signal 102, an input enable signal 104, a ground signal 106, an output voltage signal 108, a P-channel MOSFET 110 and a GDLS portion 112.

High-side power switch 100 may operate as a mechanism for connecting and disconnecting a load (not shown) to a system power source.

Input voltage signal 102 received from an external source, may operate to supply a voltage signal. Input enable signal 104 received from an external source, may operate to supply a signal for enabling or disabling high-side power switch 100. Ground signal 106 may operate to provide a signal supplying a ground potential. Output voltage signal 108 may operate to supply a voltage signal external to high-side power switch 100.

P-channel MOSFET 110 may operate as a pass element for connecting and disconnecting a load to a system power supply.

GDLS portion 112 may operate to control the on/off condition for P-channel MOSFET 110.

GDLS portion 112 includes an N-channel MOSFET 114, a pull-down resistor 116 and a pull-up resistor 118.

N-channel MOSFET 114 may operate to provide configuration control for P-channel MOSFET 110.

Pull-down resistor 116 may operate to provide ground potential to the gate terminal of N-channel MOSFET 114 when the signal source for the gate of N-channel MOSFET 114 delivers high impedance. Furthermore, providing ground potential to the gate terminal of N-channel MOSFET 114 may operate to configure N-channel MOSFET 114 for an open condition.

Pull-up resistor 118 may be configured such that N-channel MOSFET 114 may be driven to saturation resulting in an operational condition (i.e. closed/on) for P-channel MOSFET 110.

Source of P-channel MOSFET 110 and the first terminal of pull-up resistor 118 may receive input voltage signal 102. Gate terminal of P-channel MOSFET 110 may receive a signal 120. Furthermore, signal 120 may be connected to the first terminal of pull-up resistor 118 and the drain terminal of N-channel MOSFET 114. Output voltage signal 108 may be sourced by the drain terminal of P-channel MOSFET 110. The gate terminal of N-channel MOSFET 114 and the first terminal of pull-down resistor 116 may receive input enable signal 104. The source terminal for N-channel MOSFET 114 and the second terminal of pull-down resistor 116 may receive ground signal 106.

GDLS portion 112 may be constructed in a manner where presentation of logic HIGH via input enable signal 104 results in driving the voltage to the gate terminal of P-channel MOSFET 110, denoted as $V_{G\_110}$, to a lower voltage than the voltage applied to the source terminal of P-channel MOSFET 110, denoted as $V_{S\_110}$. Furthermore, the voltage differential between $V_{S\_110}$ and $V_{G\_110}$, denoted as $V_{SG\_110}$, should be a voltage greater than the threshold voltage for P-channel MOSFET 110, where the threshold voltage for P-channel MOSFET 110 may be denoted as $V_{TH\_110}$. $V_{TH\_110}$ may be considered as the voltage for configuring P-channel MOSFET 110 for a condition of operating (i.e. closed/on). The operation as described with reference to P-channel MOSFET 110 for this paragraph may be presented by Equation 1A as shown below:

$$V_{SG\_110}=V_{S\_110}-V_{G\_110}>V_{TH\_110} \quad (1A)$$

Typically, $V_{G\_110}$ may be driven to a voltage near ground potential in order to ensure the condition as presented by Equation 1A may be satisfied, and further ensure that P-channel MOSFET 110 operates on the boundary between its saturation region and its non-saturation region (e.g. voltage differential between P-channel MOSFET 110 source terminal and drain terminal=$V_{SD\_110}=V_{S\_110}-V_{D\_110}=V_{SG\_110}-V_{TH\_110}$) to maximize the current supplied by P-channel MOSFET 110 while minimizing $V_{SD\_110}$.

For a condition of input enable signal 104 configured for logic LOW or high impedance, GDLS portion 112 may operate to drive $V_{G\_110}$ to a voltage level greater than the differential of $V_{S\_100}$ and $V_{TH\_110}$, as presented Equation 1B as shown below:

$$V_{SG\_110}=V_{S\_110}-V_{G\_110}<V_{TH\_110} \quad (1B)$$

Typically, $V_{G\_110}$ may be driven to a voltage approximate to $V_{S\_110}$ in order to ensure the conditions as presented by Equation 1B may be satisfied (i.e. P-channel MOSFET 110 configured for condition of non-operating/off).

The operational/non-operational state (i.e. open/closed or on/off) for N-channel MOSFET 114 may be controlled via input enable signal 104. For presentation of a logic HIGH to input enable signal 104, N-channel MOSFET 114 may be considered as configured for a closed (i.e., on) condition. The value of pull-up resistor 118 may be chosen such that N-channel MOSFET 114 may be driven to saturation. Furthermore, $V_{G\_110}$ may be configured for a voltage slightly greater than ground potential, resulting in configuration of P-channel MOSFET 110 for a closed/on condition. For presentation of a logic LOW (e.g. ground potential) to input enable signal 104, N-channel MOSFET 114 may be considered as configured for an open (i.e., off) condition. Furthermore, $V_{G\_110}$ may be pulled up to the voltage level of $V_{S\_110}$ by pull-up resistor 118, resulting in the configuration of P-channel MOSFET 110 for a condition of open (i.e., off). For high impedance applied to input enable signal 104, the gate terminal of N-channel MOSFET 114 may be pulled to ground potential by pull-down resistor 116. Furthermore, N-channel MOSFET 114 may be configured for a condition of open (i.e., off). Furthermore, $V_{G\_110}$ of P-channel MOSFET 110 may be pulled up to the voltage level of $V_{S\_110}$ by pull-up resistor 118, resulting in configuration of P-channel MOSFET 110 for a condition of open (i.e., off).

FIG. 2 presents an illustration of a conventional high-side power switch.

A high-side power switch 200 includes an input voltage signal 202, an input enable signal 204, a ground signal 206, an output voltage signal 208, a P-channel MOSFET 210 and a GDLS portion 212.

High-side power switch 200 may operate as a mechanism for connecting and disconnecting a load to a system power source.

Input voltage signal 202 received from an external source, may operate to supply a voltage signal. Input enable signal 204 received from an external source, may operate to supply a signal for enabling or disabling high-side power switch 200. Ground signal 206 may operate to provide a signal supplying a ground potential. Output voltage signal 208 may operate to supply a voltage signal external to high-side power switch 200.

P-channel MOSFET 210 may operate as a pass element for connecting and disconnecting a load to a system power supply.

GDLS portion 212 may operate to control the on/off condition for P-channel MOSFET 210.

GDLS portion 212 includes an N-channel MOSFET 214, a pull-down resistor 216 and a P-channel MOSFET 218.

N-channel MOSFET 214 and P-channel MOSFET 218 may operate to provide configuration control for P-channel MOSFET 210.

When the signal source for the gate of N-channel MOSFET 214 and P-channel MOSFET 218 delivers high impedance, pull-down resistor 216 may operate to provide ground potential to the gate terminal of N-channel MOSFET 214 and the gate terminal of P-channel MOSFET 218. Furthermore, providing ground potential to the gate terminal of N-channel MOSFET 214 may operate to configure N-channel MOSFET 214 for an open condition. Furthermore, providing ground potential to the gate terminal of P-channel MOSFET 218 may operate to configure P-channel MOSFET 218 for a closed and saturation condition.

The source terminal of P-channel MOSFET 210 and the source terminal of P-channel MOSFET 218 may receive input voltage signal 202. Gate terminal of P-channel MOSFET 210 may receive a signal 220. Furthermore, signal 220 may be connected to the drain terminal of P-channel MOSFET 218 and the drain terminal of N-channel MOSFET 214. Output voltage signal 208 may be sourced by the drain terminal of P-channel MOSFET 210. The gate terminal of N-channel MOSFET 214, the gate terminal of P-channel MOSFET 218 and the first terminal of pull-down resistor 216 may receive input enable signal 204. The source terminal for N-channel MOSFET 214 and the second terminal of pull-down resistor 216 may receive ground signal 206.

For a logic HIGH presented to input enable signal 204, N-channel MOSFET 214 may be driven to operation in the saturation region and as a result configured for a condition of closed. Furthermore, P-channel MOSFET 218 may be configured for a condition of open. Furthermore, the gate terminal of P-channel MOSFET 210 may be configured for a voltage potential of ground (or near ground), resulting in a configuration for P-channel MOSFET 210 of closed (i.e. on). For a logic LOW presented to input enable signal 204, N-channel MOSFET 214 may be configured for a condition of open. Furthermore, P-channel MOSFET 218 may be configured for operation in the saturation region and considered as a closed condition. Furthermore, the voltage for the gate terminal of P-channel MOSFET 210 may be configured for a voltage level associated with the source voltage of P-channel MOSFET 210, resulting in a configuration of an open (i.e. off) condition for P-channel MOSFET 210. For high impedance presented to input enable signal 204, input enable signal 204 may be pulled down to ground potential via pull-down resistor 216, or a similar condition as a logic LOW presented to input enable signal 204. Furthermore, N-channel MOSFET 214 may be configured for an open condition. Furthermore, P-channel MOSFET 218 may be configured for saturation resulting in a closed condition. Furthermore, the voltage of the gate terminal for P-channel MOSFET 210 may be driven to the voltage of the source terminal of P-channel MOSFET 210 (or near), resulting in a configuration of open (or off) for P-channel MOSFET 210.

The high-side power switches as described with reference to FIG. 1 and FIG. 2 may operate adequately for connecting and disconnecting a load from a system power supply.

Details associated with Power Supply Rejection Ratio (PSRR) may be introduced in order to further discuss noise rejection associated with the switches as described with reference to FIGS. 1-2. The ability for the high-side power switches to reject noise associated with a system power supply may be calculated via PSRR. The high-side power switches as discussed with reference to FIGS. 1-2 may be considered essentially as a unity gain voltage amplifier without a feed back loop. As a result, the PSRR for the high-side power switches of FIGS. 1-2 may be presented by Equation 2A as shown below:

$$\text{PSRR} = \Delta V_{DD}/\Delta V_{OUT} = \Delta V_{IN}/\Delta V_{OUT} \quad (2A)$$

PSRR may also be expressed in decibels as presented by Equation 2B as shown below:

$$\text{PSRR} = 20\log(\Delta V_{IN}/\Delta V_{OUT}) \quad (2B)$$

From Equation 2A and Equation 2B for the high-side power switches of FIG. 1-2, the voltage gain may considered as approximately unity with feedback loop not configured. Furthermore, the PSRR may be unity (or 0 dB) and may be interpreted as not providing noise or ripple rejection.

In view of the foregoing, there is a need for improved techniques for providing noise rejection techniques for power supplies.

BRIEF DESCRIPTION OF THE DRAWINGS

The present invention is illustrated by way of example, and not by way of limitation, in the figures of the accompanying drawings and in which like reference numerals refer to similar elements and in which.

Figure 1:
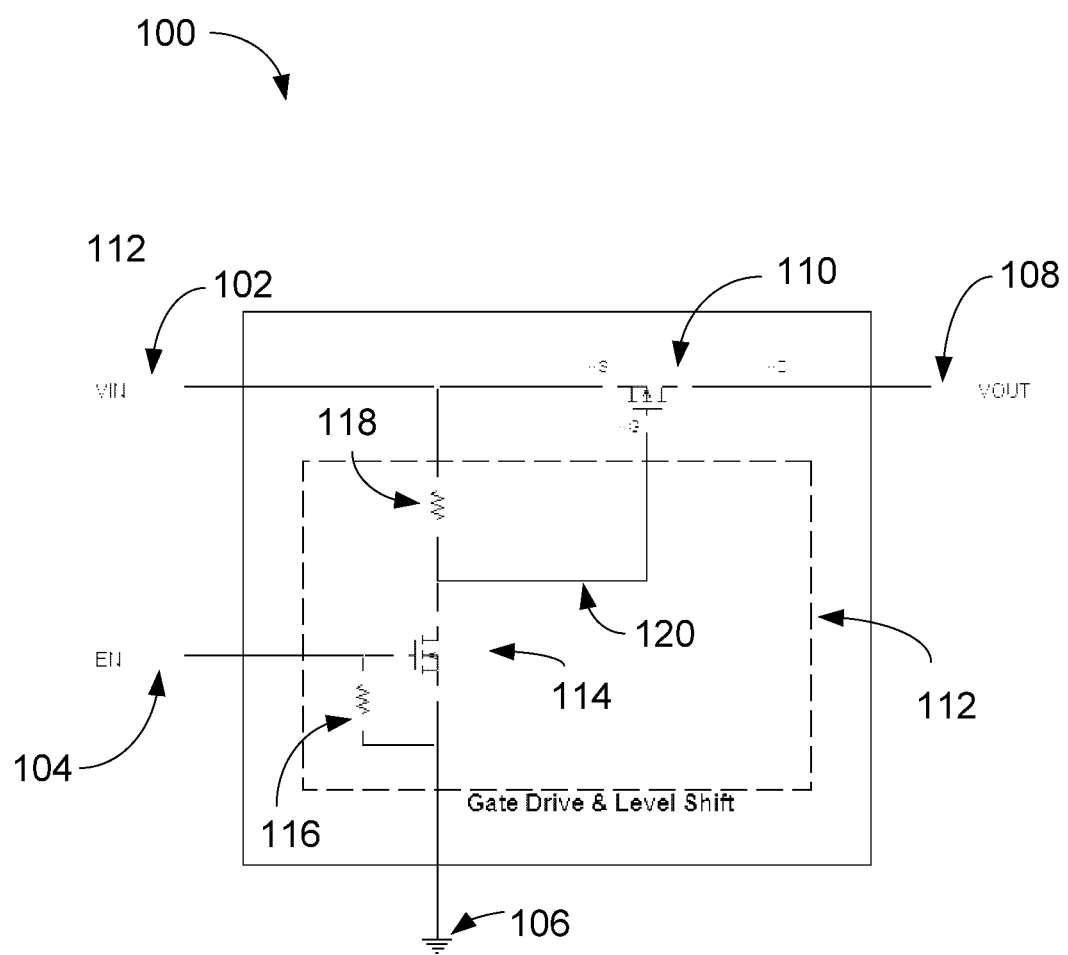
FIG. 1 presents an illustration of a conventional high-side power switch.
Figure 2:
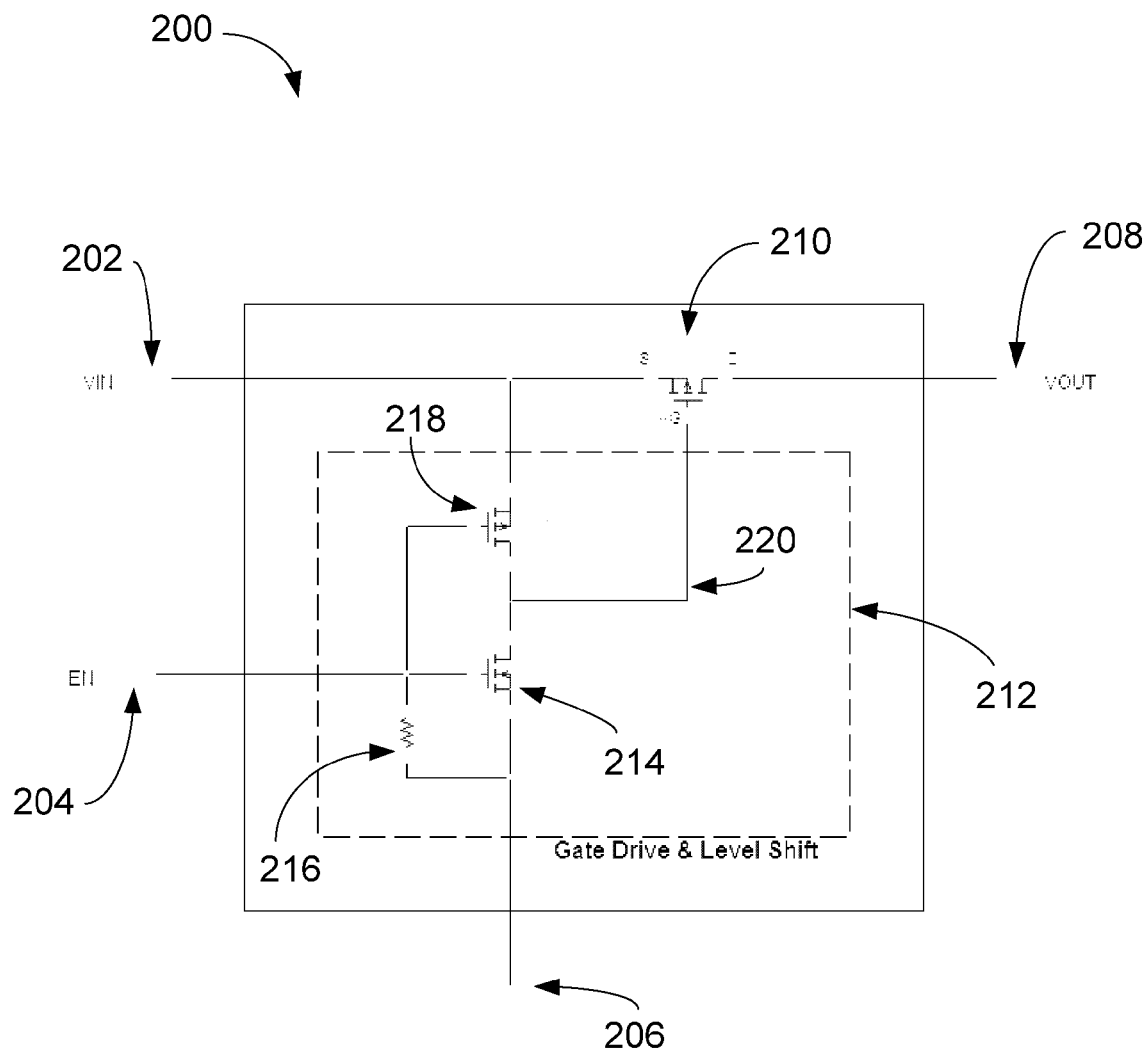
FIG. 2 presents an illustration of a conventional high-side power switch.

Unless otherwise indicated illustrations in the figures are not necessarily drawn to scale.

SUMMARY OF THE INVENTION

To achieve the forgoing and other objects and in accordance with the purpose of the invention, a noise rejecting high-side power switch is presented.

In one embodiment an apparatus includes a pass element comprising an input, an output and a control input. The pass element is configured to be operable in a first mode, with a first signal on the control input, for substantially passing a voltage from the input to the output and to be operable in a second mode, with a second signal on the control input, for substantially blocking the voltage on the input from passing to the output. A differential amplifier includes a non-inverting input coupled to the input, an inverting input coupled to the output, an amplifier output coupled to the control input and a bias current connection. The differential amplifier is configured to be operable in a first mode, with a bias current supplied to the bias current connection, for supplying the first signal along with a closed feedback loop from the output where an amount of noise on the input is rejected and to be operable is a second mode for supplying the second signal in absence of the bias current. A current source includes a current source output coupled to the bias current connection and an enable input. The current source is configured to be operable in a first mode, with an enable signal present on the enable input, for supplying the bias current and to be operable in a second mode, in absence of the enable signal, for disabling the supplying of the bias current. In another embodiment a Power Supply Rejection Ratio (PSRR) associated with the pass element is substantially greater than 1. In yet another embodiment the pass element comprises a P-FET. In still another embodiment the P-FET comprises a P-channel MOSFET. In another embodiment the pass element comprises a PNP transistor.

In another embodiment an apparatus includes means responsive to a first signal for substantially passing a voltage from an input to an output and responsive to a second signal for substantially blocking the voltage on the input from passing to the output, means responsive to a bias current for supplying the first signal along with a closed feedback loop from the output where an amount of noise on the input is rejected and in absence of the bias current for supplying the second signal and means responsive to an enable signal for supplying the bias current and in absence of the enable signal for disabling the supplying of the bias current.

In another embodiment an apparatus includes a pass element includes an input, an output and a control input. The pass element is configured to be operable in a first mode, with a first signal on the control input, for substantially passing a voltage from the input to the output and to be operable in a second mode, with a second signal on the control input, for substantially blocking the voltage on the input from passing to the output. A differential amplifier includes a first transistor configured as a non-inverting input coupled to the input, a second transistor configured as an inverting input coupled to the output, a third transistor and a fourth transistor configured as a current mirror with the third transistor coupled to the first transistor and the fourth transistor coupled to the second transistor, an amplifier output coupled to the first transistor, the third transistor and the control input, and a bias current connection coupled to the first transistor and the second transistor. The differential amplifier is configured to be operable in a first mode, with a bias current supplied to the bias current connection, for supplying the first signal along with a closed feedback loop from the output where an amount of noise on the input is rejected and to be operable is a second mode for supplying the second signal in absence of the bias current. A current source includes a current transistor configured as a current source output coupled to the bias current connection and an enable input coupled to the current transistor. The current source is configured to be operable in a first mode, with an enable signal present on the enable input, for supplying the bias current and to be operable in a second mode, in absence of the enable signal, for disabling the supplying of the bias current. In another embodiment a Power Supply Rejection Ratio (PSRR) associated with the pass element is substantially greater than 1. In yet another embodiment the pass element comprises a P-FET. In still another embodiment the P-FET comprises a P-channel MOSFET. In another embodiment the pass element comprises a PNP transistor. In yet another embodiment the first transistor and the second transistor each comprise a N-FET. In still another embodiment the N-FET comprises a N-channel MOS. In another embodiment the first transistor and the second transistor each comprise a NPN transistor. In yet another embodiment the third transistor and the fourth transistor each comprise a P-FET. In still another embodiment the P-FET comprises a P-channel MOS. In another embodiment the third transistor and the fourth transistor each comprise a PNP transistor. In another embodiment current transistor comprises a N-FET. In yet another embodiment the N-FET comprises a N-channel MOS. In still another embodiment the current transistor comprises a NPN transistor.

Other features, advantages, and objects of the present invention will become more apparent and be more readily understood from the following detailed description, which should be read in conjunction with the accompanying drawings.

DETAILED DESCRIPTION OF THE PREFERRED EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will now be described in detail with reference to embodiments thereof as illustrated in the accompanying drawings.

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Embodiments of the present invention will be described for providing means and methods for a high-side power supply switch with capability of performing power supply noise rejection.

A power supply switch may operate to perform power supply noise rejection using a closed feedback loop. A high-side power supply switch providing noise rejection capability with non-unity (or non-0 dB) PSRR is described. A P-channel MOSFET pass element, a feedback loop including a differential amplifier with greater than unity open loop gain and a current source are included. The feedback loop, with the input voltage and output voltage as the non-inverting and inverting inputs may be used to form a closed loop in order to provide a non-unity (or non-0 dB) PSRR to the high-side power switch. The current source, with the enable signal as the control input, may operate to provide a bias current associated with operation of the differential amplifier.

An example transistor level implementation of the high-side power supply switch with noise rejection is described. In the transistor level implementation, a differential amplifier with current mirror load may be constructed with MOSFETs. Furthermore, the input voltage and output voltage may be configured as the non-inverting and inverting inputs associated with the differential amplifier. Furthermore, a closed loop may be configured in order to provide a non-unity (or non-0 dB) PSRR associated with the high-side power switch. The current source may be configured as an N-channel MOSFET. Furthermore, the current drain-to-source for the N-channel MOSFET current source may be controlled by the voltage level of an enable signal.

Figure 3:
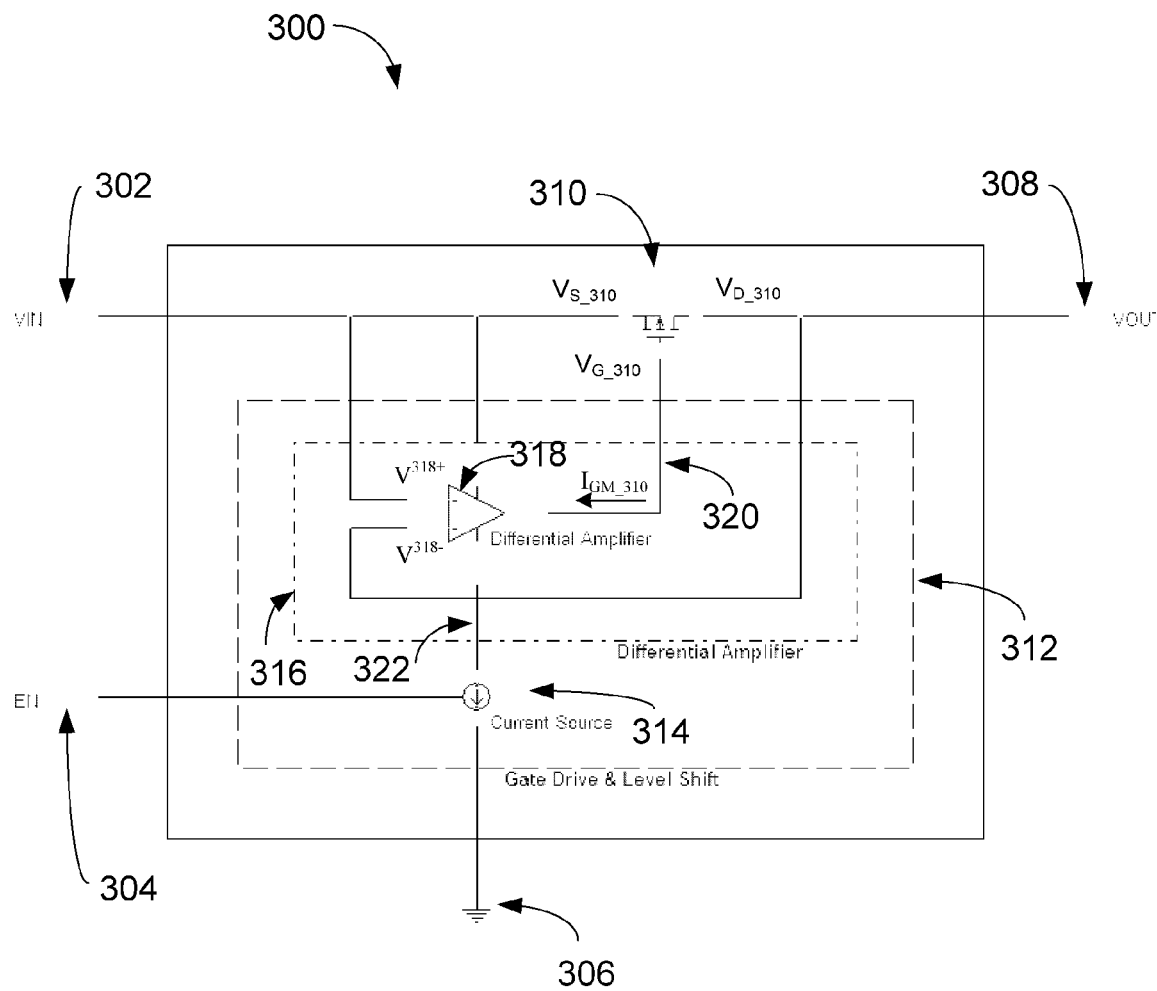
FIG. 3 presents an illustration of an example high-side power switch, in accordance with an embodiment of the present invention.

FIG. 3 presents an illustration of an example high-side power switch, in accordance with an embodiment of the present invention.

A high-side power switch 300 includes an input voltage signal 302, an input enable signal 304, a ground signal 306, an output voltage signal 308, a P-channel MOSFET 310 and a GDLS portion 312.

High-side power switch 300 may operate as a mechanism for connecting and disconnecting a load to a system power source with capability to perform noise rejection.

Input voltage signal 302 received from an external source, may operate to supply a voltage signal. Input enable signal 304 received from an external source, may operate to supply a voltage signal for enabling or disabling high-side power switch 300. Ground signal 306 may operate to provide a signal supplying a ground potential. Output voltage signal 308 may operate to supply a voltage signal with associated noise rejection to entities located external to high-side power switch 300.

P-channel MOSFET 310 may operate as a pass element for connecting and disconnecting a load to a system power supply.

GDLS portion 312 may operate to control the on/off condition for P-channel MOSFET 310 and provide a feedback loop associated with a differential amplifier for aiding with noise rejection.

GDLS portion 312 includes a current source 314 and a differential amplifier portion 316.

Current source 314 may operate to provide a configurable source for current. Non-limiting examples of configuration for current source 314 include enabled and disabled.

Differential amplifier portion 316 may operate to control the on/off condition for P-channel MOSFET 310 and provide a feedback loop for aiding with noise rejection.

Differential amplifier portion 316 includes a differential amplifier 318. Differential amplifier 318 may operate to control the on/off condition for P-channel MOSFET 310 and provide a feedback loop for aiding with noise rejection.

An enable terminal for current source 314 may receive input enable signal 304. Furthermore, a first terminal of current source 314 may receive ground signal 306 for supplying ground potential. Negative power terminal for differential amplifier 318 may be connected to a second terminal of current source 314 via a signal 322. Positive input terminal and positive power terminal of differential amplifier 318 may receive input voltage signal 302. Negative input terminal of differential amplifier 318 may be connected to the drain terminal of P-channel MOSFET 310 by output voltage signal 308 via feedback. Source terminal for P-channel MOSFET 310 may receive input voltage signal 302. Gate terminal for P-channel MOSFET 310 may be connected to the output terminal of differential amplifier 318 via a signal 320.

For presentation of a logic LOW or high impedance to input enable signal 304, current source 314 may be configured for inactivation. Furthermore, differential amplifier 318 may be configured for inactivation. Furthermore, P-channel MOSFET 310 may be configured for open. As a result, high-side power switch 300 may be considered as nonconductive.

For a transition of input enable signal 304 to logic HIGH, current source 314 may be activated. Furthermore, a bias current may be established by current source 314. Furthermore, differential amplifier 318 may initiate operating.

The differential voltage input to differential amplifier 318, denoted at $(V^{318+} - V^{318-})$, may operate to determine the amount of current sinking, denoted as $I_{GM\_310}$, into the output terminal of differential amplifier 318 from the gate terminal of P-channel MOSFET 310. The larger the voltage differential $(V^{318+} - V^{318-})$, the larger the current $I_{GM\_310}$. A reduced current from the gate of P-channel MOSFET 310 to the output terminal of differential amplifier 318 may operate to decrease the gate voltage, denoted as $V_{G\_310}$, of P-channel MOSFET 310 and increase the voltage drop between the source and gate of P-channel MOSFET 310, denoted as $V_{SG\_310}$ ($V_{SG\_310} = V_{S\_310} - V_{G\_310}$).

For a $V_{SG\_310}$ increasing in value and increasing greater than the threshold voltage for P-channel MOSFET 310, denoted as $V_{TH\_310}$, P-channel MOSFET 310 may initiate operation. Furthermore, output voltage signal 308 may initiate increasing in voltage. Output voltage signal 308 represents the inverting input terminal for differential amplifier 318 (or $V^{318-}$) and as the voltage of output voltage signal 308 increases, the voltage differential $(V^{318+} - V^{318-})$ decreases. For a decreasing voltage differential $(V^{318+} - V^{318-})$, the current from gate of P-channel MOSFET 310 to the output terminal of differential amplifier 318 ($I_{GM\_310}$) decreases. For output voltage signal 308 increasing to the same voltage as presented to input voltage signal 302 (ignoring small voltage drop across P-channel MOSFET 310), the voltage differential ($V^{318+}-V^{318-}$) decreases to zero volts. Furthermore, $I_{GM\_310}$ decreases to zero amperes. Furthermore, differential amplifier 318 achieves equilibrium with P-channel MOSFET 310 configured as a closed condition (i.e. on).

The configuration of high-side power switch 300 as illustrated in FIG. 3 may be considered as similar in operation to a Low Dropout (LDO) regulator. A LDO regulator may be considered a Direct Current (DC) linear voltage regulator which can operate with a very small input-to-output differential voltage. Furthermore, differential amplifier 318 may be considered as equivalent to an error amplifier associated with an LDO regulator with input voltage signal 302 connected to the non-inverting terminal of differential amplifier 318 and the output voltage signal 308 connected to the inverting input of differential amplifier 318. The PSRR for the embodiment as illustrated in FIG. 3 may be analyzed similar to an LDO regulator with PSRR calculated as presented in Equation 3A shown below:

$$PSRR = A_V/A_{VO} \tag{3A}$$

PSRR may also be calculated in decibels as presented in Equation 3B and shown below:

$$PSRR = 20 \log(A_V/A_{VO}) \tag{3B}$$

Where $A_V$ (Equations 3A-B) may represent the open loop gain for differential amplifier 318 and $A_{VO}$ (Equations 3A-B) may represent the voltage gain from input voltage signal 302 to output voltage signal 308 with an open feedback loop for differential amplifier 318.

Based on Equations 3A-B, the PSRR may be configured for non-unity (or non-0 dB) by manipulation of the values for $A_V$ and $A_{VO}$. The calculations associated with $A_V$ and $A_{VO}$ will be further described in the following paragraphs with reference to FIG. 4.

Figure 4:
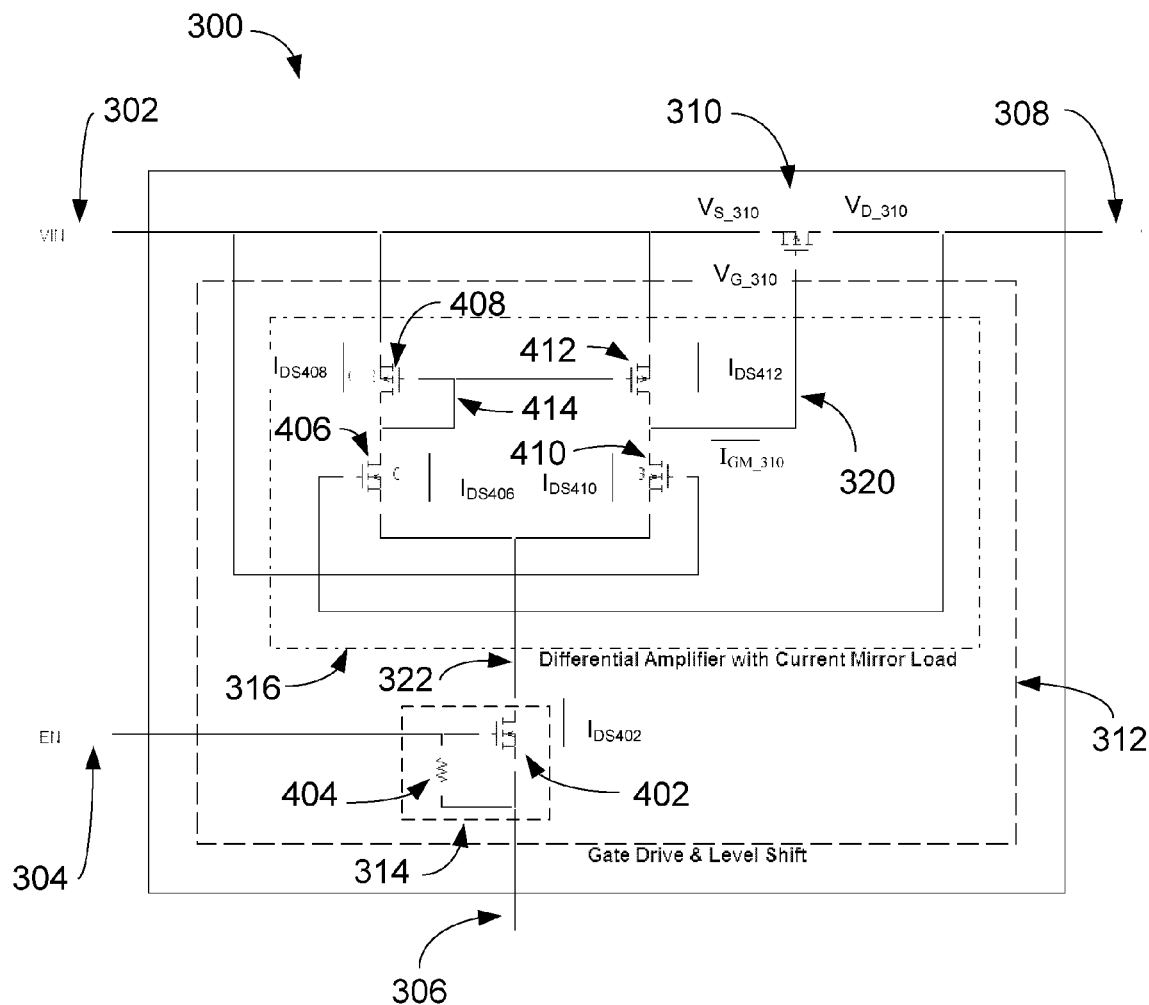
FIG. 4 presents an illustration of an example transistor level implementation for the high-side power switch as described with reference to FIG. 3 using a differential amplifier with current mirror load as a feedback/gain circuit and an N-channel MOSFET as a current source, in accordance with an embodiment of the present invention.

FIG. 4 presents an illustration of an example transistor level implementation for the high-side power switch as described with reference to FIG. 3 using a differential amplifier with current mirror load as a feedback/gain circuit and an N-channel MOSFET as a current source, in accordance with an embodiment of the present invention.

Items of FIG. 4 in common with FIG. 3 will not be described with reference to FIG. 4. For a discussion of items associated with FIG. 4 in common with FIG. 3, the reader may refer to the previous discussion with reference to FIG. 3.

High-side power switch 300 includes input voltage signal 302, input enable signal 304, ground signal 306, output voltage signal 308, P-channel MOSFET 310 and GDLS portion 312.

GDLS portion 312 includes current source 314 and differential amplifier portion 316.

Current source 314 includes an N-channel MOSFET 402 and a pull-down resistor 404.

N-channel MOSFET 402 may operate to provide a bias current for enabling operation of differential amplifier portion 316.

Pull-down resistor 404 may operate to provide ground potential to the gate terminal of N-channel MOSFET 402 when the signal source for the gate of N-channel MOSFET 402 delivers high impedance. Furthermore, providing ground potential to the gate terminal of N-channel MOSFET 402 may operate to configure N-channel MOSFET 402 for an open condition.

Gate of N-channel MOSFET 402 and first terminal of pull-down resistor 404 may be connected to input enable signal 304. Source of N-channel MOSFET 402 and second terminal of pull-down resistor 404 may be connected to ground signal 306 for realizing ground potential. Drain terminal of N-channel MOSFET 402 may be connected to negative power terminal for differential amplifier portion 316.

Differential amplifier portion 316 includes an N-channel MOSFET 406, a P-channel MOSFET 408, an N-channel MOSFET 410 and a P-channel MOSFET 412.

Gate terminal of N-channel MOSFET 406 may be connected to output voltage signal 308 and drain terminal of P-channel MOSFET 310 with the connection operating as a feedback path. Source terminal of N-channel MOSFET 406 may be connected to source terminal of N-channel MOSFET 410 and drain terminal of N-channel MOSFET 402. Drain terminal of N-channel MOSFET 406 may be connected via a signal 414 to drain terminal of P-channel MOSFET 408, gate terminal of P-channel MOSFET 408 and gate terminal of P-channel MOSFET 412. Drain terminal of N-channel MOSFET 410 may be connected to drain terminal of P-channel MOSFET 412 and to gate terminal of P-channel MOSFET 310 via signal 320. Source terminal of P-channel MOSFET 408, source terminal of P-channel MOSFET 412, gate terminal of N-channel MOSFET 410 and source terminal of P-channel MOSFET 310 may be connected to input voltage signal 302.

N-channel MOSFET 406 and N-channel MOSFET 410 may be configured with similar physical and electrical properties. P-channel MOSFET 408 and P-channel MOSFET 412 may be configured with similar physical and electrical properties. P-channel MOSFET 408 and P-channel MOSFET 412 may operate as a current mirror load. The current mirror load may operate to condition the gate terminal voltage ($V_{G\_310}$) of P-channel MOSFET 310, which will be explained fully in the subsequent paragraphs. N-channel MOSFET 402 may operate to provide a bias current for operation of differential amplifier portion 316.

For a presentation of logic HIGH to input enable signal 304, N-channel MOSFET 402 may be configured for closed (i.e. on) and operating in the saturation region. Furthermore, the drain current for N-channel MOSFET 402, denoted as $I_{DS402}$, may be maintained as a constant value, as denoted by $I_{C402}$. $I_{DS402}$ may be considered as equal to the sum of the currents for N-channel MOSFET 406 and N-channel MOSFET 410, denoted as $I_{DS406}$ and $I_{DS410}$, respectively. The calculation for $I_{DS402}$ may be presented by Equation 4 as shown below:

$$I_{DS402} = I_{DS406} + I_{DS410} = I_{C402} \tag{4}$$

Since P-channel MOSFET 408 and P-channel MOSFET 412 operate as a current mirror and may be configured with similar physical/electrical properties, the currents from drain terminal to source terminal, denoted as $I_{DS408}$ and $I_{DS412}$, respectively, may be considered as equal as presented by Equation 5 shown below:

$$I_{DS408} = I_{DS412} \tag{5}$$

It may also be shown that the currents from drain to source for P-channel MOSFET 408 and N-channel MOSFET 406 may be considered as equal as presented by Equation 6 shown below:

$$I_{DS406} = I_{DS408} \tag{6}$$

The current for $I_{DS410}$ may be shown to be as presented by Equation 7, as shown below:

$$I_{DS410} = I_{DS412} + I_{GM\_310} \tag{7}$$

Prior to P-channel MOSFET 310 configured for a closed condition (i.e. on), output voltage signal 308 may be considered as exhibiting ground potential. Output voltage signal 308, associated with the inverting input of differential amplifier portion 316, and connected to the gate terminal of N-channel MOSFET 406 may operate to configure N-channel MOSFET 406 in an open condition (i.e. off). Furthermore, as a result of N-channel MOSFET 406 configured in an open condition, $I_{DS406}$ may be considered as exhibiting zero amperes. Furthermore, based upon Equations 5 and 6, $I_{DS408}$ and $I_{DS412}$ may also be considered as exhibiting zero amperes. Furthermore, based upon Equation 7, $I_{Ds410}$ may be considered as equal to $I_{GM\_310}$ and also $I_{C402}$. Solving Equations 4-7 for the conditions as described in this paragraph, Equation 8 may be presented as shown below:

$$I_{DS402}=I_{DS410}=I_{GM\_310}=I_{C402} \quad (8)$$

The voltage for the gate terminal of P-channel MOSFET 310, $V_{G\_310}$, may be considered as a function of the electrical charge accumulated on the gate terminal and the capacitance associated with the gate terminal. Furthermore, the gate terminal charge may be expressed as Equation 9 as shown below:

$$Q_{G\_310}=-\int I_{GM\_310}dt=-C_{G\_310}V_{G\_310} \quad (9)$$

Where $Q_{G\_310}$ may be considered as the charge accumulated at the gate terminal of P-channel MOSFET 310 and $C_{G\_310}$ may be considered as the capacitance for the gate terminal of P-channel MOSFET 310. Generally, gate terminal capacitance $C_{G\_310}$ may not be considered a constant, however for analysis purposes and from a conceptual point of view it may be considered as a constant associated with the context of this discussion. The negative sign for Equation 9 indicates current ($I_{GM\_310}$) flows away from the gate terminal of P-channel MOSFET 310. Furthermore, $V_{G\_310}$ decreases in voltage and since the voltage of $V_{S\_310}$ remains constant, the voltage of $V_{SG\_310}$ increases.

With the voltage of $V_{SG\_310}$ increasing, at a certain point in time, as denoted by Δt, it may be considered as equal to the threshold voltage of P-channel MOSFET 310, $V_{TH\_310}$, or as presented by Equation 10, as shown below:

$$V_{SG\_310}=V_{TH\_310} \quad (10)$$

At the point in time as denoted by Δt, the configuration for P-channel MOSFET 310 may be considered as open (i.e. off).

Prior to configuring P-channel MOSFET 310 for a closed condition and with continual current flowing from the gate terminal of P-channel MOSFET 310, the condition as presented by Equation 11, shown below, becomes valid:

$$V_{SG\_310}>V_{TH\_310} \quad (11)$$

Equation 11 indicates that at the moment in time P-channel MOSFET 310 initiates operation, its drain voltage, $V_{D\_310}$, as a result of the initiation of operation for P-channel MOSFET 310, begins increasing from ground potential.

After initiation of operation for P-channel MOSFET 310 and an increasing voltage realized for output voltage signal 308, the voltage of output voltage signal 308 and also the gate terminal of N-channel MOSFET 406 increase such that voltage may be considered greater than the threshold voltage for N-channel MOSFET 406. Furthermore, N-channel MOSFET 406 may initiate operation with a non-zero drain terminal-to-source terminal current $I_{DS406}$, denoted as $\Delta I_{406}$. Furthermore, the value of $\Delta I_{406}$ may be a function of time, t. Based upon Equation 4 and 5, $I_{DS408}$ and $I_{DS412}$ may also be considered as equal to $\Delta I_{406}$ as presented by Equation 12 as shown below:

$$I_{DS406}=I_{DS408}=I_{DS412}=\Delta I_{406} \quad (12)$$

Furthermore, based upon Equation 4, and as a result of $I_{DS402}$ remaining equal to the constant current of $I_{C402}$, Equation 13, as shown below, may be considered as valid:

$$I_{DS410}=I_{DS402}-I_{DS406}=I_{C402}-\Delta I_{406} \quad (13)$$

Furthermore, based upon Equations 7 and 12, Equation 14 may be presented as shown below:

$$I_{DS410}=I_{DS412}+I_{GM\_310}=\Delta I_{406}+I_{GM\_310}=I_{C402}-\Delta I_{406} \quad (14)$$

Furthermore, Equation 15, shown below, may be presented as a result of solving the previously presented equations:

$$I_{GM\_310}=I_{C402}-2\Delta I_{406} \quad (15)$$

Furthermore, when $I_{GM\_310}$ exhibits zero amperes, the voltage $V_{GS\_310}$ ceases to decrease (or $|V_{GS\_310}|$ ceases to increase). Furthermore, as observed from Equation 15, Equations 16A and 16B may be presented as shown below:

$$I_{C402}-2\Delta I_{406}=0 \quad (16A)$$

or $$\Delta I_{406}=I_{C402}/2 \quad (16B)$$

Furthermore, based on the conditions of Equations 5, 6 and 7, Equations 17 and 18, as shown below, may be considered as valid:

$$I_{DS406}=I_{DS408}=I_{DS410}=I_{DS412}=I_{C402}/2 \quad (17)$$

$$I_{GM\_310}=0 \quad (18)$$

Equations 17 and 18 indicate circuit reaching an equilibrium point. Furthermore, Equations 17 and 18 indicate $|V_{GS\_310}|$ of P-channel MOSFET 310 having reached a maximum value and P-channel MOSFET 310 being fully configured for a condition of closed (i.e. on).

It may be shown that the current for the gate terminal of P-channel MOSFET 310, $I_{GM\_310}$, may not flow in the direction of the gate terminal for P-channel MOSFET 310, as this condition requires output voltage signal 308 (or $V_{D\_310}$ of P-channel MOSFET 310) to be higher than input voltage signal 302 (or the $V_{S\_310}$ of P-channel MOSFET 310), which cannot occur.

The PSRR calculation for the example circuit as illustrated in FIG. 4 may be presented as Equations 19A and 19B, as shown below:

$$PSRR=A_V/A_{VO} \quad (19A)$$

or in decibels $$PSRR=20 \log(A_V/A_{VO}) \quad (19B)$$

For Equations 19A and 19B, $A_V$ may be considered as the open loop gain of differential amplifier portion 316. Furthermore, $A_{VO}$ may be considered as the voltage gain from the input terminal to output terminal of differential amplifier portion 316 with an open feedback loop.

For FIG. 4, the gate terminal of N-channel MOSFET 410 may be considered as the non-inverting input, as denoted by $V^{318+}$ in FIG. 3, of differential amplifier portion 316 with connection to input voltage signal 302. The gate terminal of N-channel MOSFET 406 may be considered as the inverting input, denoted as $V^{318-}$ in FIG. 3, of differential amplifier portion 316 with connection to output voltage signal 308.

For presentation of a logic HIGH to input enable signal 304, the open loop gain, as denoted by $A_O$, of differential amplifier portion 316 may be given by Equation 20A, as shown below:

$$A_V=K/I^{1/2} \quad (20A)$$

For Equation 20A, K represents a constant associated with the physical properties of the materials used for fabricating N-channel MOSFET 406 and N-channel MOSFET 410 forming a portion of differential amplifier portion 316. Furthermore, I represents the current traversing N-channel MOSFET 402.

Furthermore, the voltage gain from the input voltage terminal, denoted as $V_{IN}$, to the output voltage terminal, denoted as $V_{OUT}$, with the feedback loop for differential amplifier portion 316 configured for open, denoted as $A_{VO}$, may be presented as Equation 20B, as shown below:

$$A_{VO}=V_{OUT}/V_{IN} \tag{20B}$$

For P-channel MOSFET 310 configured for operation, $V_{SG\_310}$ may be adjusted, associated with a load current, denoted as $-I_{DS310}$ (negative sign for $-I_{DS310}$ indicates the load current traverses from source terminal to gate terminal of P-channel MOSFET 310). Furthermore, P-channel MOSFET 310 may be configured for operation associated with the boundary located between the saturation region and the non-saturation region. Furthermore, configuration for operation between the saturation region and the non-saturation region may operate to maintain a low voltage drop associated with P-channel MOSFET 310, denoted as $V_{SD\_310}$ ($V_{SD\_310}=V_{S\_310}-V_{D\_310}$). The voltage drop associated with P-channel MOSFET 310 may also be denoted as output voltage signal 308 subtracted from input voltage signal 302. Based on this, $V_{SD\_310}$ may be several orders of magnitude lower than input voltage signal 302. Furthermore, output voltage signal 308 may be near the voltage of input voltage signal 302. Based on this, $A_{VO}$ may be considered unity or approximately unity. Furthermore, with an $A_{VO}$ of unity or approximately unity, Equations 19A and 19B may be simplified as presented by Equations 21A and 21B as shown below:

$$PSRR=A_V=K/I^{1/2} \tag{21A}$$

or in decibels $$PSRR=20\log(A_V)=20\log(K/I^{1/2}) \tag{21B}$$

Based on Equations 21A and 21B, PSRR may be configured for non-unity (or non-0 dB) via manipulation of the physical properties for N-channel MOSFET 406 and N-channel MOSFET 410 associated with differential amplifier portion 316 and the physical properties of N-channel MOSFET 402 associated with the current source 314. With non-unity PSRR given by Equations 21A and 21B, the high-side power switch 300 now exhibits noise rejection property.

Those skilled in the art will readily recognize, in light of and in accordance with the teachings of the present invention, that any of the foregoing steps may be suitably replaced; reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied. Thus, the present invention is not limited to any particular tangible means of implementation.

Having fully described at least one embodiment of the present invention, other equivalent or alternative methods of providing high-side power supply switch noise rejection according to the present invention will be apparent to those skilled in the art. The invention has been described above by way of illustration, and the specific embodiments disclosed are not intended to limit the invention to the particular forms disclosed. For example, the particular implementation of the transistors may vary depending upon the particular type power supply used. The transistors described in the foregoing were directed to noise rejection for RF subsystem implementations; however, similar techniques may be provided for other types of subsystems such as, but not limited to subsystems associated with analog and digital electronics. Implementations of the present invention are contemplated as within the scope of the present invention. The invention is thus to cover all modifications, equivalents, and alternatives falling within the spirit and scope of the following claims.

Claim elements and steps herein may have been numbered and/or lettered solely as an aid in readability and understanding. Any such numbering and lettering in itself is not intended to and should not be taken to indicate the ordering of elements and/or steps in the claims.

What is claimed is:

1. An apparatus comprising:
   a pass element comprising an input, an output and a control input, said pass element being configured to be operable in a first mode, with a first signal on said control input, for substantially passing a voltage from said input to said output and to be operable in a second mode, with a second signal on said control input, for substantially blocking the voltage on said input from passing to said output;
   a differential amplifier comprising a non-inverting input coupled to said input, an inverting input coupled to said output, an amplifier output coupled to said control input and a bias current connection, said differential amplifier being configured to be operable in a first mode, with a bias current supplied to said bias current connection, for supplying said first signal along with a closed feedback loop from said output where an amount of noise on said input is rejected and to be operable in a second mode for supplying said second signal in absence of said bias current; and
   a current source comprising a current source output coupled to said bias current connection and an enable input, said current source being configured to be operable in a first mode, with an enable signal present on said enable input, for supplying said bias current and to be operable in a second mode, in absence of said enable signal, for disabling said supplying of said bias current.

2. The apparatus as recited in claim 1, in which a Power Supply Rejection Ratio (PSRR) associated with said pass element is substantially greater than 1.

3. The apparatus as recited in claim 1, in which said pass element comprises a P-FET.

4. The apparatus as recited in claim 3, in which said P-FET comprises a P-channel MOSFET.

5. The apparatus as recited in claim 1, in which said pass element comprises a PNP transistor.

6. An apparatus comprising:
   means for substantially passing a voltage from an input to an output in a first mode, in response to a first signal on a control input, and for substantially blocking the voltage on said input from passing to said output in a second mode, in response to a second signal on said control input;
   means for supplying said first signal along with a closed feedback loop from said output in a first mode, in response to a bias current, where an amount of noise on said input is rejected, and for supplying said second signal in absence of said bias current; and means for supplying said bias current in a first mode in response to an enable signal, and for disabling said supplying of said bias current in a second mode in absence of said enable signal.

7. An apparatus comprising:

a pass element comprising an input, an output and a control input, said pass element being configured to be operable in a first mode, with a first signal on said control input, for substantially passing a voltage from said input to said output and to be operable in a second mode, with a second signal on said control input, for substantially blocking the voltage on said input from passing to said output;

a differential amplifier comprising a first transistor configured as a non-inverting input coupled to said input, a second transistor configured as an inverting input coupled to said output, a third transistor and a fourth transistor configured as a current mirror with said third transistor coupled to said first transistor and said fourth transistor coupled to said second transistor, an amplifier output coupled to said first transistor, said third transistor and said control input, and a bias current connection coupled to said first transistor and said second transistor, said differential amplifier being configured to be operable in a first mode, with a bias current supplied to said bias current connection, for supplying said first signal along with a closed feedback loop from said output where an amount of noise on said input is rejected and to be operable in a second mode for supplying said second signal in absence of said bias current; and a current source comprising a current transistor configured as a current source output coupled to said bias current connection and an enable input coupled to said current transistor, said current source being configured to be operable in a first mode, with an enable signal present on said enable input, for supplying said bias current and to be operable in a second mode, in absence of said enable signal, for disabling said supplying of said bias current.

8. The apparatus as recited in claim 7, in which a Power Supply Rejection Ratio (PSRR) associated with said pass element is substantially greater than 1.

9. The apparatus as recited in claim 7, in which said pass element comprises a P-FET.

10. The apparatus as recited in claim 9, in which said P-FET comprises a P-channel MOSFET.

11. The apparatus as recited in claim 7, in which said pass element comprises a PNP transistor.

12. The apparatus as recited in claim 7, in which said first transistor and said second transistor each comprise a N-FET.

13. The apparatus as recited in claim 12, in which said N-FET comprises a N-channel MOS.

14. The apparatus as recited in claim 7, in which said first transistor and said second transistor each comprise a NPN transistor.

15. The apparatus as recited in claim 12, in which said third transistor and said fourth transistor each comprise a P-FET.

16. The apparatus as recited in claim 15, in which said P-FET comprises a P-channel MOS.

17. The apparatus as recited in claim 14, in which said third transistor and said fourth transistor each comprise a PNP transistor.

18. The apparatus as recited in claim 7, in which said current transistor comprises a N-FET.

19. The apparatus as recited in claim 18, in which said N-FET comprises a N-channel MOS.

20. The apparatus as recited in claim 7, in which said current transistor comprises a NPN transistor.

* * * * *